United States Patent
Box et al.

(10) Patent No.: US 7,116,399 B2
(45) Date of Patent: Oct. 3, 2006

(54) LITHOGRAPHIC APPARATUS, DEVICE MANUFACTURING METHOD, AND DEVICE MANUFACTURED THEREBY

(75) Inventors: Wilhelmus Josephus Box, Eksel (BE); Antonius Johannes Josephus Van Dijsseldonk, Hapert (NL); Dominicus Jacobus Petrus Adrianus Franken, Veldhoven (NL); Martinus Hendrikus Antonius Leenders, Rotterdam (NL); Erik Roelof Loopstra, Heeze (NL); Josephus Jacobus Smits, Geldrop (NL); Marc Wilhelmus Maria Van Der Wijst, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 130 days.

(21) Appl. No.: 10/844,570

(22) Filed: May 13, 2004

(65) Prior Publication Data

US 2005/0018154 A1    Jan. 27, 2005

(30) Foreign Application Priority Data

May 13, 2003    (EP)    ................................... 03076433

(51) Int. Cl.
  *G03B 27/42*    (2006.01)
  *G03B 27/54*    (2006.01)
  *G02B 7/02*    (2006.01)
(52) U.S. Cl. .......................... 355/53; 355/67; 359/820
(58) Field of Classification Search ................. 355/30, 355/53–67; 359/811–820
  See application file for complete search history.

(56) References Cited

U.S. PATENT DOCUMENTS

| | | | |
|---|---|---|---|
| 6,118,599 A | * | 9/2000 | Spinali ........................ 359/820 |
| 6,621,557 B1 | * | 9/2003 | Takahashi ..................... 355/67 |
| 6,750,949 B1 | * | 6/2004 | Loopstra et al. ............... 355/53 |
| 6,867,848 B1 | * | 3/2005 | Ebinuma et al. ............... 355/75 |
| 6,992,306 B1 | | 1/2006 | Honda et al. |
| 2001/0038446 A1 | | 11/2001 | Takahashi |
| 2001/0050759 A1 | | 12/2001 | Kamiya |
| 2002/0027644 A1 | | 3/2002 | Bisschops |

FOREIGN PATENT DOCUMENTS

| | | |
|---|---|---|
| JP | 2004-29314 | 1/2001 |
| JP | 2003-234276 | 8/2003 |
| JP | 2004-80025 | 3/2004 |

\* cited by examiner

*Primary Examiner*—Henry Hung Nguyen
(74) *Attorney, Agent, or Firm*—Pillsbury Winthrop Shaw Pittman, LLP

(57) ABSTRACT

A lithographic projection apparatus contains a projection system configured to project a patterned beam of radiation onto a target portion of a substrate. The projection system contains one or more optically active mirrors and heat shields located to intercept heat radiation to or from the mirrors and/or their support. The heat shields are actively cooled and the mirrors and the heat shields and the mirrors are supported separately on a support frame to reduce vibration of the mirrors due to active cooling. The heat shields may include heat shields that intercept heat radiation to or from the support and/or respective heat shields for individual mirrors that intercept heat radiation to or from the mirrors.

16 Claims, 4 Drawing Sheets

LITHOGRAPHIC APPARATUS, DEVICE MANUFACTURING METHOD, AND DEVICE MANUFACTURED THEREBY

This application claims priority to European Patent Application 03076433.6, filed May 13, 2003, the contents of which are incorporated by reference.

FIELD OF THE INVENTION

The present invention relates to a lithographic projection apparatus, a device manufacturing method and a device manufactured thereby.

DESCRIPTION OF THE RELATED ART

The term "patterning devices" as here employed should be broadly interpreted as referring to a device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning devices is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the ease of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such a device is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The matrix addressing can be performed using suitable electronics. In both of the situations described hereinabove, the patterning devices can include one or more programmable mirror arrays. More information on mirror arrays as here referred to can be found in, for example, U.S. Pat. Nos. 5,296,891 and 5,523,193, and PCT Patent Application Publications WO 98/38597 and WO 98/33096, which are incorporated herein by reference. In the case of a programmable mirror array, the support may be embodied as a frame or table, for example, which may be fixed or movable as needed.

Another example of a patterning device is a programmable LCD array. An example of such a construction is given in U.S. Pat. No. 5,229,872, which is incorporated herein by reference. As above, the support structure in this case may be embodied as a frame or table, for example, which may be fixed or movable as needed.

For purposes of simplicity, the rest of this text may, at certain locations, specifically direct itself to examples involving a mask and mask table. However, the general principles discussed in such instances should be seen in the broader context of the patterning devices as set forth above.

Lithographic projection apparatus can be used, for example, in the manufacture of integrated circuits (ICs). In such a case, the patterning devices may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper or step-and-repeat apparatus. In an alternative apparatus, commonly referred to as a step-and-scan apparatus, each target portion is irradiated by progressively scanning the mask pattern under the beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be found in, for example, U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are needed, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens." However, this term should be broadly interpreted as encompassing various types of projection systems, including refractive optics, reflective optics, and catadioptric systems, for example. The radiation system may also include components operating according to any of these design types to direct, shape and/or control the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. Nos. 5,969,441 and 6,262,796, both incorporated herein by reference.

From European Patent Application Publication 1 178 357 ("EP '357"), a lithographic apparatus is known of which most of the components are located in a vacuum chamber. The beam of radiation images the mask onto the substrate via a number of optically active mirrors instead of lenses. Such a configuration is needed, for example, when an EUV (extreme ultraviolet) beam is used because an EUV beam in gases at atmospheric pressure would be useless for projection purposes and because no refractive optical elements are available for EUV radiation. The same holds for other types of beams.

EP '357 notes that operation under vacuum can cause temperature stability problems, because heat radiation from the walls of the vacuum chamber or from the vacuum pump could lead to thermal expansion or contraction. This results in imaging errors when temperature sensitive components, for example the support, the substrate table, the projection system or the reference frame, are affected. EP '357 addresses this problem with the use of a "temperature control member," which is effectively a heat shield interposed between heat sources and temperature sensitive components. The heat shield surrounds at least part of the temperature sensitive component that is kept isothermal. In one embodiment the heat shield has a high absorption finish on a side facing the temperature critical component, to regulate the temperature of the temperature sensitive component by radiation incident from the heat shield. By "regulating" EP '357 appears to mean merely that radiation from the shield stabilizes the temperature of the temperature sensitive component. No active temperature control loop is shown.

Of course, this type of solution only works if the heat shield itself does not heat to an arbitrary temperature. EP '357 does not mention how this should be ensured in the presence of strong heat sources. Moreover, absorption of radiation from the beam of radiation in the projection system may turn the projection system itself into both a temperature sensitive component and a heat source at the same time, making it impossible to interpose heat shields between all heat sources and temperature sensitive components.

SUMMARY OF THE INVENTION

In principle, active heat transport, for example fluid cooling or heating, may be used to control the temperature of temperature sensitive components. It is also desirable that such active heat transport be regulated by a control loop to keep temperatures stable. However, this type of heat transport, when applied to the projection system of a lithographic projection apparatus, may lead to mechanical vibrations that result in imaging errors, for example due to forced cooling or to the necessary mechanical connections. Such problems increase when more cooling capacity is needed.

It is an aspect of the present invention to provide temperature stability of the projection system of a lithographic apparatus with active heat transport while minimizing the effect of mechanical vibration due to heat transport.

It is another aspect of the present invention to make it possible to use a control loop to regulate temperatures affecting the projection system.

It is another aspect of the present invention to reduce heating problems due to absorption of the beam in the projection system of a lithographic apparatus.

According to an embodiment of the invention, mirrors of the projection system and/or their support structure are shielded by heat shields. An active heat transport circuit is used to thermally condition the heat shields. The heat transport circuit may include pipes to transport heat transport fluid coupled directly or indirectly to the heat shields. Generally the heat transport has a net cooling effect on the heat shields, but alternatively the heat transport may have a net heating effect that is reduced if temperature rises too much.

The heat shields are supported separately from the mirrors and their support. As a result, vibrations due to active cooling have a minimal effect on the mirrors. The only common support of the heat shields and the mirrors and their support is a common metrology frame, or on another frame that supports the mirrors via the metrology frame. In one embodiment, both the heat shields and the support are supported by the metrology frame and there is no other mechanical interconnections between the heat shields and the support or the mirrors.

The heat shields intercept heat radiation to or from the mirrors and/or the support. The heat shields may a shape and be positioned so that they intercept the major part (at least 50% and desirably more than 80%) of heat radiation to or from the shielded support and so that only a minor part of the intercepted heat radiation is not to or from the shielded support or mirror. Respective heat shields may each shield only a respective mirror or part of the support as much as possible from all other components in this way.

Thus, a minimum heat transport is needed for each heat shield, reducing the amount of vibration and selective temperature regulation of the mirrors and/or the support from the heat shields is simplified. This may be achieved, for example, when the heat shield tightly follows a surface of the relevant mirror or part of the support, so that the distance between the heat shield and the surface is smaller than the spatial extent of the heat shield.

In one embodiment the heat shield is provided for an outer surface of the support of the mirrors that faces away from the mirrors. Such an outer surface is most susceptible to heat radiated from other components. The support may encase the mirrors except for holes for passing the beam and/or for allowing a high vacuum to be realized inside the support. More particularly the support of the mirrors may be arranged so that it surrounds the mirrors on both sides along at least one axis, heat shields being provided on the outer surfaces on both sides.

The absorption coefficient of the surface of the heat shield that faces away from the support may be lower than that of the surface of the heat shield that faces the support structure (e.g. more than 0.8 on the surface facing the support and less than 0.2 on the surface facing away from the support). Thus, the heat shield serves to determine the temperature of the support and a minimum of cooling is needed to compensate for heat absorbed from outside the support. Alternatively a high absorption coefficient (>0.8) or a low absorption coefficient (>0.2) may be used on both surfaces at least locally, for example high absorption where there is sufficient active cooling capacity on the surface and low absorption where there is less cooling capacity.

In another embodiment the heat shields include mirror shields for individual ones of the optically active mirrors of the projection system. The mirror shield of a mirror does not cover a part of the front surface of the mirror, from which the beam is reflected, but otherwise the mirror heat shield may cover as much of the mirror as possible, and at least a back surface opposite the front surface. At least the mirror shield is located so that the major part of the heat radiation that it intercepts is to or from the mirror that is shielded, and the major part of the heat radiation to or from the mirror except for heat radiation to or from the part of the front surface from which the projection beam is reflected.

The mirror shield absorbs heat radiation generated by heating due to beam reflection losses. By using mirror shields for individual mirrors the amount of cooling is minimized as well as effects on the support of the mirrors. The mirror shield may face at least a back surface of the mirror, but may also be shaped so that it also faces sides of the mirror between the front and the back surface of the mirror, and even may be shaped to face a part of the front surface on which the projection beam is not incident.

The surface of the mirror heat shield that faces the mirror may have a higher absorption coefficient than the surface that faces away from the mirror. Thus, heating of the mirror shield is reduced, which may be desirable if, due to space limitations, only small heat transfer capacity is available for a mirror. Alternatively a high absorption coefficient (>0.8) may be used on the surface of the mirror shield facing away from the mirror, to prevent reflection of heat radiation towards other mirrors or the support structure.

In another embodiment the heat shields include an inner heat shield that covers an inner surface of the support, which faces one or more of the mirrors. The surface of the inner heat shield that faces the mirrors may have a lower absorption coefficient than the surface that faces away from the mirror to the support structure. Thus, heating of the mirrors is reduced. Alternatively a high absorption coefficient (>0.8) may be used on the surface of the mirror shield facing the mirrors, to prevent reflection of heat radiation towards other mirrors or the support. Also a low absorption coefficient may be used at least locally towards the support.

The amount of heat transported by the heat transport circuit may be regulated with a control loop that works to keep temperatures, such as the heat shield temperature, substantially constant. When mirror heat shields are provided for individual mirrors the temperature of the mirrors is thus specifically controlled, with little or no external influence. Similarly, the temperature of the support of the mirrors is specifically controlled by providing inner and/or outer shields. As a result, the optical properties of the projection system remain stable.

According to a further aspect of the invention there is provided a device manufacturing method in which heat radiation to or from the one or more optically active mirrors and/or a support of one or more optically active mirrors is shielded with one or more heat shields that are supported separate from the one or more mirrors and its support as a whole. Heat transfer fluid is supplied to the one or more heat shields through pipes that are mechanically attached to the heat shields.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. It should be appreciated that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
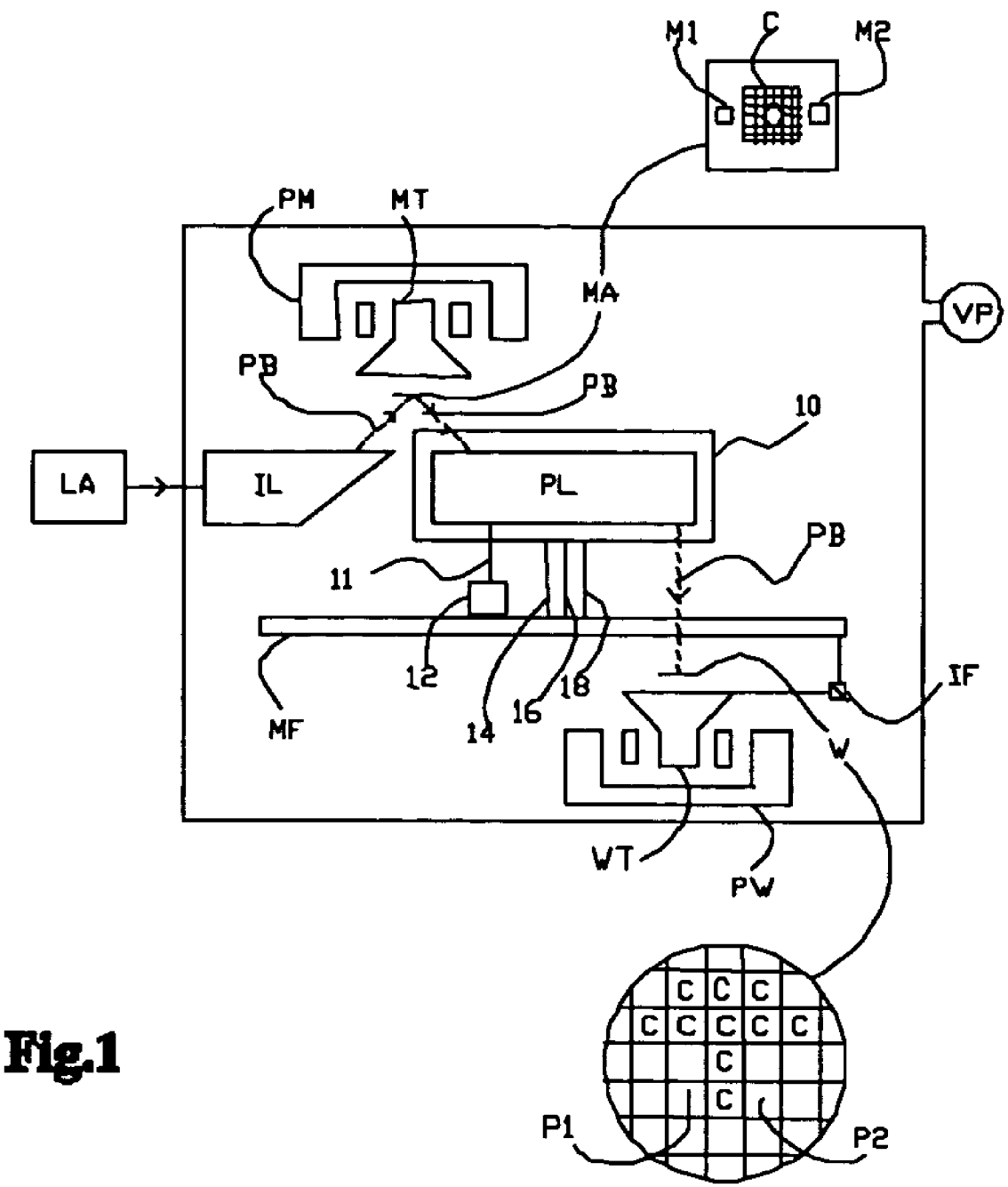
FIG. 1 depicts a lithographic projection apparatus according to an embodiment of the invention.

FIG. 1 schematically depicts a lithographic projection apparatus 1 according to an embodiment of the invention and including a radiation system LA, IL configured to supply a beam PB of radiation (e.g. EUV radiation). In this emobidment, the radiation system also includes a radiation source LA; a first object table (mask table) MT provided with a mask holder configured to hold a patterning device, illustrated in the form of a mask MA (e.g. a reticle), and connected to a first positioning device PM that accurately positions the mask with respect to a projection system ("lens") PL. A second object table (substrate table) WT is provided with a substrate holder is configured to hold a substrate W (e.g. a resist-coated silicon wafer) and is connected to a second positioning device PW that accurately positions the substrate with respect to the projection system PL. The projection system ("lens") PL (e.g. a set of mirrors) is configured to image an irradiated portion of the mask MA onto a target portion C (e.g. including one or more dies) of the substrate W.

As here depicted, the apparatus is of a reflective type (i.e. has a reflective mask). However, it may also be of a transmissive type, for example (with a transmissive mask). Alternatively, the apparatus may employ another kind of patterning device, such as a programmable mirror array of a type as referred to above.

The source LA (e.g. a laser produced plasma source or a discharge source) produces radiation. This radiation is fed into the illumination system (illuminator) IL, either directly or after having traversed a conditioning device(s), for example a beam expander. The illuminator IL may includes components configured to set the outer and/or inner radial extent (commonly referred to as σ-outer and σ-inner, respectively) of the intensity distribution in the beam. In addition, it will generally include various other components, such as an integrator and a condenser. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The present invention encompasses both of these scenarios.

The beam PB subsequently intercepts the mask MA, which is held on a mask table MT. Having been selectively reflected by the mask MA, the beam PB is processed by the projection system PL, which focuses the beam PB onto a target portion C of the substrate W. With the aid of the second positioning device PW (and interferometer IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:
1. In step mode, the mask table MT is kept essentially stationary, and an entire mask image is projected at once (i.e. a single "flash") onto a target portion C. The substrate table WT is then shifted in the X and/or Y directions so that a different target portion C can be irradiated by the beam PB; and
2. In scan mode, essentially the same scenario applies, except that a given target portion C is not exposed in a single "flash". Instead, the mask table MT is movable in a given direction (the so-called "scan direction", e.g. the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The lithographic projection apparatus includes a vacuum chamber VC in which the beam PB impinges on mask MA and subsequently onto the target area of the substrate W. A metrology frame MF, which is mechanically isolated from the main apparatus structure, provides an isolated frame of reference. The metrology frame may be, for example, a heavy table supported by air mounts (not shown) that provide a resilient support with a low elastic coefficient. The metrology frame MF supports sensitive components, for example the interferometer IF and other position sensors and isolate them from vibration.

The projection system PL is supported by the metrology frame ME via a resilient element 12 and a support 11. The projection system PL is partially surrounded by a shield 10, which includes its own support 14 on metrology frame ME, and is coupled to a supply pipe 16 for heat transport fluid and an abduction pipe 18 for the heat transport liquid.

Figure 2:
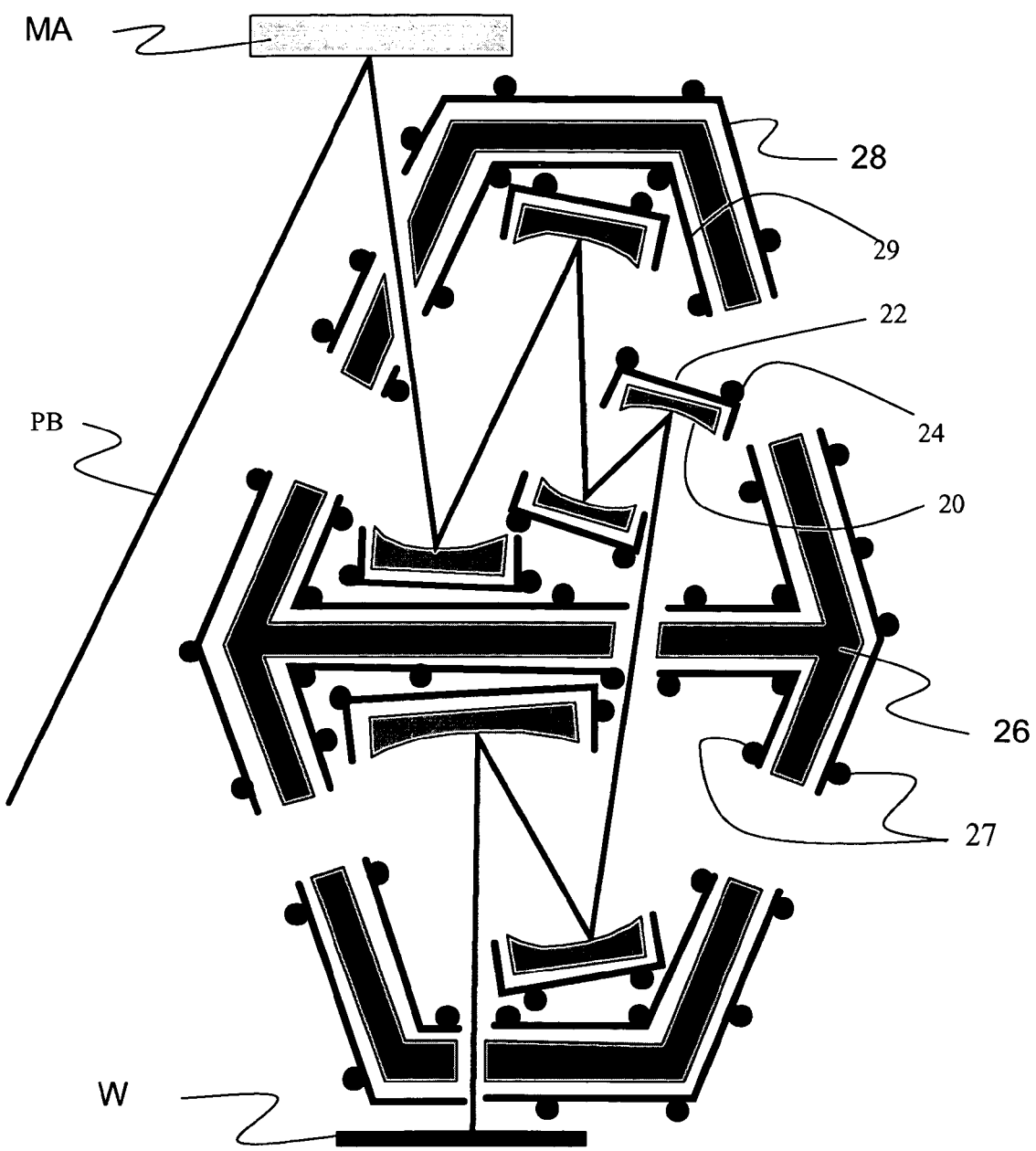
FIG. 2 shows a projection system.

FIG. 2 shows an embodiment of projection sytem PL and its shield structure in more detail. The projection system PL contains a number of optically active mirrors 20 (only one of which is provided with a reference number) and a projection system support 26. The mirrors 20 are arranged to image the mask MA onto the substrate W. The mirrors 20 and the support 26 are made of, for example, a glass with low expansion coefficient such as ZERODUR® or ULE® (Ultra Low Expansion) glass. INVAR® may also be used for the support 26.

The support 26 may include legs to which the mirrors 20 are attached and a box in which the mirrors 20 are placed and which mostly surrounds the mirrors 20, substantially except for openings through which the beam PB passes. Alternatively a cage may be used. The box or cage with the mirrors 20 is supported on the metrology frame MF.

The shield contains mirror shields 22 (only one of which is provided with a reference number), an outer shield 28 and an inner shield 29. As can be appreciated from FIG. 1, the optically active mirrors 20, the support 26, the mirror shields 22, the outer shield 28 and the inner shield 29 each have their own support on metrology frame MF. The mirror shields 22, the outer shield 28 and the inner shield 29 may have a combined support on the metrology frame MF, or separate supports may be used. The supports, particularly for the shields, may alternatively be connected to the vacuum chamber VC or to a base frame (not shown) other than the metrology frame. The support 14 is supported via the resilient element 12 to isolate the support 14 from vibrations of the metrology frame MF. Although only one resilient element 12 is shoxkrn for the sake of clarity, it should be appreciated that the support 14 may be supported via a number of such elements in parallel. Similarly, the shields 28, 29, 22 may be supported on more than one point on metrology frame MF, none of them via the resilient element 12, or other resilient elements that support the projection system support 26.

Figure 2A:
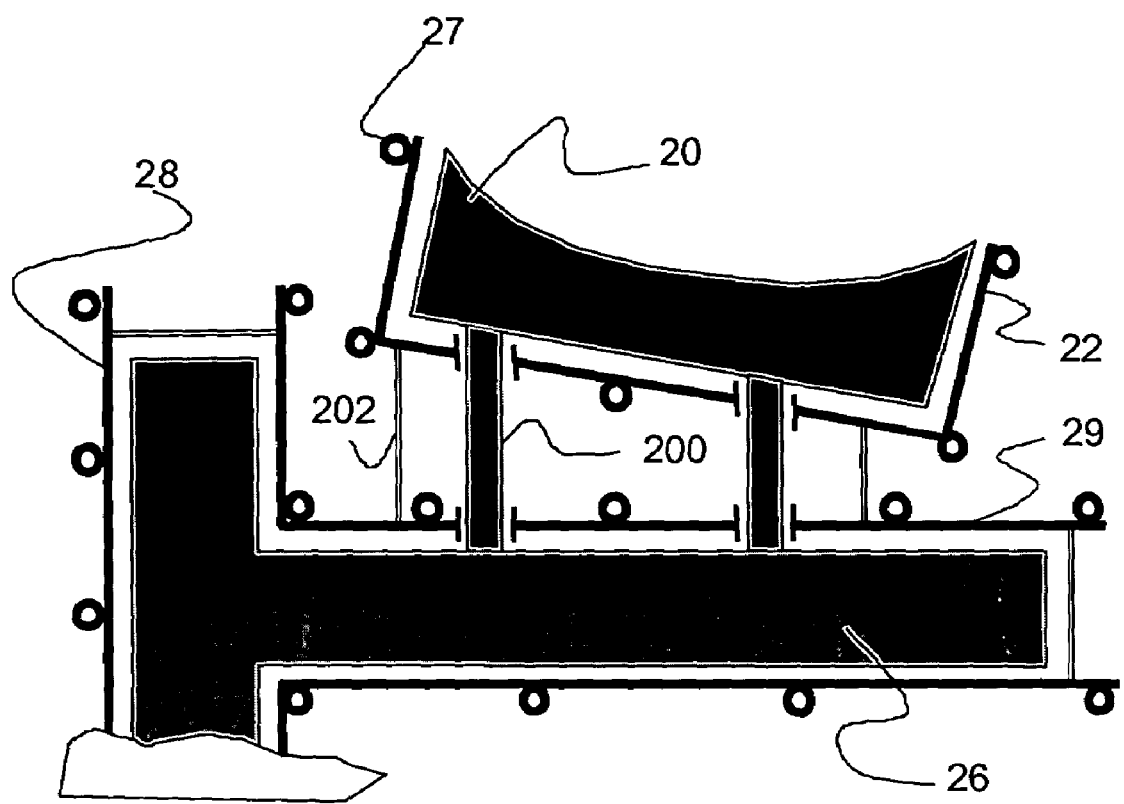
FIG. 2a shows a detail of a projection system.

FIG. 2a shows a detail of the projection system, illustrating the mechanical connections 200 between support structure 26 and a mirror 20, separated from mirror shield 22. Preferably, mirror shield 22 has support connections 202 to inner shield 29, but alternatively mirror shield 22 may be supported separately.

A respective mirror shield 22 is provided for each of mirrors 20. Each mirror shield 22 tightly surrounds its mirror 20 substantially entirely except for the face of mirror 20 that reflects the beam PB and connections that support the mirror 20 on the support 26. The exact geometrical arrangement of the mirror shields 22 may be varied, but they are desirably shaped so that the majority of heat radiation intercepted by the mirror shields 22 is heat radiation to or from the mirror 20 and not between other structures. The mirror shields 22 are arranged so that they intercept a major part (e.g.>50%) of the heat radiation to or from an optically active mirror 20, except for heat radiation from the part of the optically active mirror 20 that reflects the beam PB.

Figure 4:
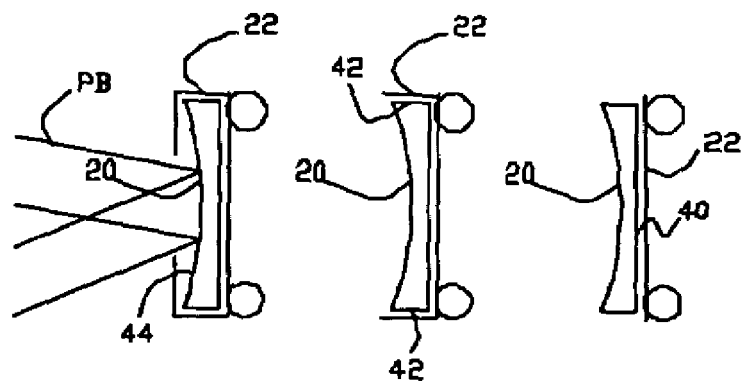
FIG. 4 shows a number of alternative mirror shield configurations.

FIG. 4 shows various configurations of a mirror shield 22, provided only on the back surface 40 of an optically active mirror 20, or following the shape of the optically active mirror 20 so that sides 42 are also covered, or even a part of a front surface 44 that is not irradiated by the beam PB. The latter construction prevents heating by other structures and heating of other structures as much as possible.

Heat transport pipes 24 may be attached to the mirror shields 22. The outer shield 28 is provided adjacent the face of support 26 that faces away from the mirrors 20 and the inner shield 29 is provided adjacent the face of the support 26 that faces towards the mirrors 20. Heat transport pipes 27 may be provided on both the outer shield 28 and the inner shield 29. The heat transport pipes 24, 27 may be arranged in a serial circuit, or a parallel circuit.

Figure 5:
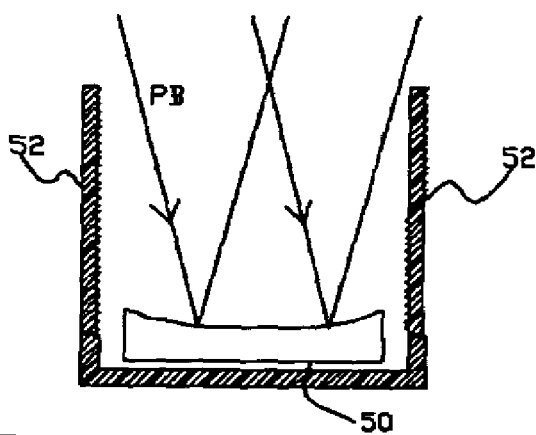
FIG. 5 shows a further mirror shield configuration.

FIG. 5 shows an alternative embodiment, wherein a heat shield 52 extends along a direction along an average normal to the surface of mirror 50. In this way, at least some of the radiation from the reflecting surface of mirror 50 is intercepted by the cooled heat shield 52. Preferably the heat shield 52 extends as far as possible without intercepting the beam PB, typically at least one half of a diameter of the mirror 50. The shield 52 may be cylindrical around the normal, only the cross-section of the cylinder with a plane though the mirror being shown in FIG. 5. However, parallel plane shields may be used.

In operation the beam PB is incident on the mask MA. The mask MA is imaged onto the substrate W by the optically active mirrors 20. Heat transport fluid is fed through the heat transport pipes 24, 27. Water may be used as heat transport fluid. The mirror shields 22 limit the temperature swing of the mirrors 20. When the beam PB is reflected by the mirrors 20 inevitably some absorption occurs. The absorption may lead to imaging problems, when it affects the geometrical relation between the mirrors 20, the mask MA and the substrate W. When submicron accuracy is needed, very small disturbances can already be damaging. This is especially a problem for short wavelength beams PB, such as EUV beams, because such a beam requires high vacuum (making it difficult to sink absorbed heat) and involves relatively high absorption.

The mirror shields 22 absorb heat radiated from the mirrors 20. Excess heat is removed via the heat transport pipes 24. Thus, the effect of heating of the mirrors 20 is reduced and the temperature of the mirrors 20 approximates a thermal equilibrium with the mirror shields 22, as determined by the heat transport fluid. By placing the mirror shields 22 tightly around the mirrors 20 it is ensured that with a minimum of shield material a maximum of heat is absorbed and as little as possible heat radiation from other sources reaches the mirrors 20. Thus, a small heat transport capacity suffices for the mirror shields 22. Because the mirror shields 22 are supported on the metrology frame MF separately from the mirrors 20, mechanical vibrations due to the flow of heat transport fluid do not significantly influence the position of the mirrors 20.

In addition, the mirror shields 22 prevent heat radiating from other structures from heating the mirrors 20.

The surfaces of the mirror shields 22 may be treated so that the heat radiation absorption coefficient of the inner surfaces that tightly face the mirrors 20 is higher than that of the outer surfaces that do not tightly face the mirrors 20. By polishing aluminium, for example, the absorption coefficient can be made as low as 0.05. A similar effect can be achieved by coating with a gold layer. By coating with a ceramic layer, such as aluminium oxide, absorption coefficients of 08. to 0.9 can be achieved. It should be appreciated that the invention is not limited to these ways of affecting absorption. Any known technique may be used. The absorption coefficient of the inner surfaces should be as high as possible, for example more than 0.8, or even more than 0.9, whereas the absorption coefficient of the outer surfaces should be as low as possible, for example less than 0.2, or even less than 0.1. As a result, a minimum of heat transport is needed for the mirror shields 22 to prevent heating from other structures.

The outer shield 28 of the support 26 serves to counteract geometrical deformation of the support 26 due to heating. The outer shield 28 keeps the temperature of the support 26 at a reduced level. The temperature of the support 26 approximates a thermal equilibrium with the outer shield 28, as determined by the heat transport fluid. Thus geometrical deformation of the projection system due to deformation of the support 26 is substantially prevented. In addition, the outer shield 28 counteracts heating of the support 26 due to radiation from external heat sources.

The outer shield 28 may be shaped and positioned so that it intercepts a major part of heat radiation to or from the outer surface of the support 26 and so that at most a minor part (e.g. <10%) of the intercepted radiation is not to or from the support 26. Any desirable geometrical arrangement of shields may be used for this purpose.

The surface of the outer shield 28 may be treated so that the heat radiation absorption coefficient of the inner surface that faces the support 26 is higher than that of the outer surfaces that do not tightly face the support 26. The absorption coefficient of the inner surfaces should be as high as possible, for example more than 0.8, or even more than 0.9, whereas the absorption coefficient of the outer surfaces should be as low as possible, for example less than 0.2, or even less than 0.1. As a result, a minimum of heat transport is needed for the outer shield 28 to prevent heating from other structures.

The inner shield 29 of the support 26 counteracts geometrical deformation of the support 26 due to heating by radiation from exposed surfaces of the mirrors 20 and external heat sources that are "visible" through holes in the support 26. Large holes have to be provided to ensure high vacuum. The inner shield 29 keeps the temperature of the support 26 at a reduced level. The temperature of the support 26 approximates a thermal equilibrium with the inner shield 29, as determined by the heat transport fluid. The surface of the inner shield 29 may be treated so that the heat radiation absorption coefficient of the inner surface that tightly faces the support 26 is higher than that of the outer surfaces that do not tightly face the support 26.

The absorption coefficient of the inner surfaces should be as high as possible, for example more than 0.8, or even more than 0.9, whereas the absorption coefficient of the outer surfaces should be as low as possible, for example less than 0.2, or even less than 0.1. As a result, a minimum of heat transport is needed for the inner shield 29 to prevent heating from other structures.

Between the support 26 and the mirrors 20 actuators and sensors (not shown) may be provided to control the position of the mirrors 20. In this case the mirror shields 22 protect the mirrors 20 from radiation from these actuators and sensors. The inner shields 29 may be placed so as to interpose between the support 26 and the actuators and sensors to protect the support 26 from heat radiation from the actuators and sensors.

Although the use of the mirror shields 22, the outer shield 28 and the inner shield 29 has been described together to achieve a combined effect, it should be appreciated that each one, or combination of the shields 22, 28, 29 may be applied also in the absence of the other ones of these shields 22, 28, 29. For example, if the main cause of heating is from external heat sources radiating towards the outer surface of the support 26, the outer shield 28 may suffice on its own.

In this case, the mirror shields 22 may be used in addition when heat problems due to the beam PB arise. As another example, if the main cause of heating is the beam PB, the mirror shields 22 on their own may suffice, and the inner shields 29 may be added to protect the support 26.

Similarly, the absorption coefficients may be varied locally, for example to provide less absorption at places on the shields 22, 28, 29 that can be cooled less effectively due to space limitations, or to provide higher absorption at places that are in a reflection path from a heat source such as a mirror 20 to a temperature sensitive component such as a mirror 20, or its mirror shield 22.

Although the term "heat transport" has been used throughout for the fluid and pipes 24, 27, it should be understood that under most circumstances the pipes 24, 27 serve as cooling pipes and the fluid serves as cooling fluid, by removing excess heat through the abduction pipe 18. But without deviating from the invention the fluid may be used to maintain mirrors 20 and support at a higher temperature than normally when no beam is present. In this case heat is normally carried to the mirrors 20, but the amount of carried heat is reduced when more heat is supplied to the mirrors 20, for example by the beam.

Figure 3:
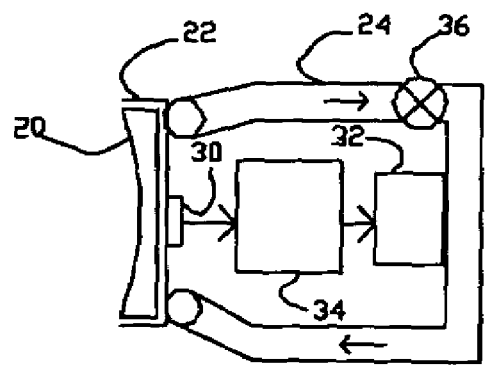
FIG. 3 shows a control loop.

FIG. 3 illustrates a further embodiment in which a control loop is used to regulate the temperature of mirrors 20 and/or the support 26. In this embodiment, one or more sensors 30 (e.g. a temperature dependent resistance) are provided on one of more of the mirror shields 22. A heater 32 is provided coupled to a supply pipe for the heat transport fluid. A control circuit 34 is coupled between sensor 30 and the heater 32, arranged to regulate the amount of heating so that the average sensed temperature is regulated towards a set temperature. A circulation pump 36 is provided in the supply pipe. Not shown in the figure is a cooling element, upstream from heater 32 to remove excess heat from the fluid.

In principle, a common heater 32 may be provided for heating fluid for all of the mirrors 20 and the support 26. In this case several sensors may be provided on different heat shields, the average sensed temperature being regulated. In another embodiment respective heaters 32 are provided in different parallel parts of the fluid flow path, so as to adjust the temperature for respective mirrors or respective groups of mirrors separately, each in response to a sensor for sensing temperature of the relevant mirror or mirrors.

However, it should be appreciated that the invention is not limited to this form of temperature regulation. Temperature regulation, possibly other than keeping fluid temperature constant, may be omitted altogether in many cases. Also without deviating from the invention, sensor 30 may be provided on the mirrors 20, or on the support 26, or sensors may be provided on both the mirror shield 22, the support 26, and/or the mirror(s) 20. Providing sensors on the heat shields minimizes mechanical disturbance of the mirrors 20. The fluid may be cooled by a regulated amount instead of heated. Instead of regulating the amount of cooling or heating, fluid flow rate may be regulated to regulate temperature.

Although the invention has been described for an embodiment that uses fluid cooling with fluid circulating through pipes, it should be appreciated that "fluid" refers to liquid, vapor, gases and mixtures thereof. It should be appreciated that other forms of active cooling may be included to transfer heat to or from the heat shields, such as heat pipes. Furthermore, although a circulating fluid path was shown, in which cooling fluid is pumped around, it should be understood that the term "heat transport circuit" as used herein does not require circulation of fluid. Fresh fluid may be used instead of circulating fluid.

While specific embodiments of the invention have been described above, it will be appreciated that the invention may be practiced otherwise than as described. The description is not intended to limit the invention.

What is claimed is:

1. A lithographic projection apparatus, comprising:
   a radiation system configured to provide a beam of radiation;
   a first support configured to support a patterning device, the patterning device configured to pattern the beam according to a desired pattern;
   a substrate table configured to hold a substrate; and
   a projection system configured to project the patterned beam onto a target portion of the substrate, the projection system comprising:
   an optically active mirror;
   a second support configured to support at least the mirror; and
   a heat radiation shield located to intercept heat radiation to or from surfaces of at least one of the second support and the mirror;
   a heat transport circuit, in thermal contact with the heat radiation shield, configured to transport heat to or from the radiation shield;
   a third support including respective separate support elements thereon to support the second support and the heat radiation shield on the third support, the support elements and the at least one heat shield being mechanically free from one another except for the support of the third support.

2. A lithographic projection apparatus according to claim 1, wherein the heat radiation shield comprises an outer shield adjacent to an outer surface of the second support that faces away from the mirror.

3. A lithographic projection apparatus according to claim 2, wherein the outer shield has a higher absorption coefficient for heat radiation on a side facing the outer surface of the second support than on a side facing away from the outer surface.

4. A lithographic projection apparatus according to claim 2, wherein the mirror has mutually opposite sides along an axis and the second support faces the mirror on either of the sides.

5. A lithographic projection apparatus according to claim 1, wherein the mirror has a front surface from which the beam is reflected and a back surface opposite the front surface, the heat radiation shield comprising a mirror shield adjacent the back surfaces of the mirror, leaving free at least a part of the front surface on which the beam is incident.

6. A lithographic projection apparatus according to claim 5, wherein the at least one mirror shield substantially surrounds the mirror, except at at least one of a part of the front surface on which the beam is incident, attachment points to the second support, and interfaces for at least one of sensors and actuators.

7. A lithographic projection apparatus according to claim 5, wherein the mirror shield has a higher absorption coefficient for heat radiation on a side facing the surfaces of the mirror than on a side facing away from the surfaces.

8. A lithographic projection apparatus according to claim 1, wherein the heat radiation shield comprises an inner shield adjacent an inner surface of the second support that faces the mirror.

9. A lithographic projection apparatus according to claim 8, wherein the inner shield has a higher absorption coefficient for heat radiation on a side facing the inner surface than on a side facing away from the inner surface.

10. A lithographic projection apparatus according to claim 1, further comprising:

a heat transport regulation loop including a temperature sensor coupled to at least one of the heat radiation shield, the second support and the mirror; and a regulating output coupled to the heat transfer circuit configured to regulate the amount of heat transported by the heat transfer circuit so that a set temperature is achieved in the at least one of the heat radiation shield, the second support and the mirror.

11. A device manufacturing method, comprising:

projecting a patterned beam of radiation onto a target portion of a layer of radiation-sensitive material on a substrate via an optically active mirror;

shielding heat radiation to or from at least one of the optically active mirror and a support for the optically active mirror with a heat radiation shield, wherein the mirror and the support as a whole are supported separately from the heat radiation shield, supplying heat transfer fluid to the heat radiation shield through pipes that are mechanically attached to the heat radiation shield.

12. A device manufacturing method according to claim 11, further comprising:

absorbing heat radiated from an outer surface of the support that faces away from the mirror with an outer shield adjacent the outer surface and included in the heat radiation shield.

13. A device manufacturing method according to claim 11, further comprising:

absorbing heat radiated from a back surface of the mirror that faces away from a front surface from which the beam is reflected with a mirror shield included in the heat radiation shield, adjacent the back surfaces of the mirror, leaving the front surface free.

14. A device manufacturing method according to claim 11, further comprising:

absorbing heat radiated towards an outer surface of the support that faces away from the mirror with an outer shield adjacent the outer surface and included in the heat radiation shield.

15. A device manufacturing method according to claim 11, further comprising:

absorbing heat radiated from an inner surface of the support that faces the mirror with an inner shield included in the heat radiation shield adjacent the inner surface of the support.

16. A lithographic projection apparatus, comprising:

a radiation system configured to provide a beam of radiation;

a first support configured to support a patterning device, the patterning device configured to pattern the beam according to a desired pattern;

a substrate table configured to hold a substrate; and a projection system configured to project the patterned beam onto a target portion of the substrate, the projection system comprising an optically active mirror, a second support configured to support the mirror and an outer shield adjacent to an outer surface of the second support that faces away from the mirror and located to intercept heat radiation to or from at least one of the outer surface of the second support and the mirror.

* * * * *